(12) United States Patent
Wu et al.

(10) Patent No.: US 10,269,634 B2
(45) Date of Patent: Apr. 23, 2019

(54) SEMICONDUCTOR DEVICE HAVING VOIDS AND METHOD OF FORMING SAME

(71) Applicant: Taiwan Semiconductor Manufacturing Company, Ltd., Hsin-Chu (TW)

(72) Inventors: Yung-Hsu Wu, Taipei (TW); Chien-Hua Huang, Toufen Township (TW); Chung-Ju Lee, Hsin-Chu (TW); Tien-I Bao, Dayuan Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 6 days.

(21) Appl. No.: 14/081,752

(22) Filed: Nov. 15, 2013

(65) Prior Publication Data

US 2015/0137378 A1    May 21, 2015

(51) Int. Cl.
*H01L 21/768* (2006.01)
*H01L 23/482* (2006.01)
*H01L 23/522* (2006.01)
*H01L 23/532* (2006.01)

(52) U.S. Cl.
CPC .... *H01L 21/76885* (2013.01); *H01L 21/7682* (2013.01); *H01L 23/5222* (2013.01); *H01L 23/53295* (2013.01); *H01L 23/53223* (2013.01); *H01L 23/53238* (2013.01); *H01L 23/53266* (2013.01); *H01L 2924/0002* (2013.01)

(58) Field of Classification Search
CPC ......... H01L 21/76802; H01L 21/76843; H01L 21/486; H01L 21/76877; H01L 2221/101; H01L 29/4991; H01L 23/481; H01L 23/5226; H01L 21/76885; H01L 21/76834
USPC ................................................ 257/734, 773
See application file for complete search history.

(56) References Cited

U.S. PATENT DOCUMENTS

| | | | | |
|---|---|---|---|---|
| 5,545,919 A * | 8/1996 | Ueda | .................... | H01L 23/3171 257/641 |
| 5,913,147 A * | 6/1999 | Dubin | .................... | H01L 21/288 257/E21.174 |
| 6,352,917 B1 * | 3/2002 | Gupta | ................ | H01L 21/76801 257/E21.576 |
| 6,369,430 B1 * | 4/2002 | Adetutu | ............ | H01L 21/76802 257/382 |
| 7,042,095 B2 * | 5/2006 | Noguchi | ........... | H01L 21/76801 257/203 |
| 7,879,683 B2 * | 2/2011 | Al-Bayati | ........... | H01L 21/3105 257/E21.573 |
| 2007/0004139 A1 * | 1/2007 | Kim et al. | ..................... | 438/257 |
| 2007/0145588 A1 * | 6/2007 | Keum | ............... | H01L 21/76802 257/758 |
| 2010/0093168 A1 * | 4/2010 | Naik | ................. | H01L 21/31144 438/618 |

(Continued)

*Primary Examiner* — David C Spalla
(74) *Attorney, Agent, or Firm* — Slater Matsil, LLP

(57) ABSTRACT

A method embodiment includes forming a hard mask over a dielectric layer and forming a first metal line and a second metal line extending through the hard mask into the dielectric layer. The method further includes removing the hard mask, wherein removing the hard mask defines an opening between the first metal line and the second metal line. A liner is then formed over the first metal line, the second metal line, and the dielectric layer, wherein the liner covers sidewalls and a bottom surface of the opening.

18 Claims, 8 Drawing Sheets

(56) References Cited

U.S. PATENT DOCUMENTS

| | | | | |
|---|---|---|---|---|
| 2010/0301489 A1* | 12/2010 | Seidel et al. | | 257/773 |
| 2012/0319279 A1* | 12/2012 | Isobayashi | H01L 23/4821 | 257/751 |
| 2013/0292835 A1* | 11/2013 | King | H01L 21/02178 | 257/741 |
| 2014/0027908 A1* | 1/2014 | Tsai | H01L 21/76885 | 257/751 |
| 2014/0131883 A1* | 5/2014 | Huang | H01L 21/7682 | 257/774 |
| 2014/0167229 A1* | 6/2014 | Teng | H01L 23/5226 | 257/649 |

* cited by examiner

SEMICONDUCTOR DEVICE HAVING VOIDS AND METHOD OF FORMING SAME

TECHNICAL FIELD

The present invention relates generally to a system and method for semiconductor device manufacturing, and, in particular embodiments, to a system and method for creating air-gaps in a semiconductor device layer.

BACKGROUND

Generally, a typical semiconductor device includes a substrate having active devices such as transistors and capacitors. These active devices are initially isolated from each other, and interconnect structures are subsequently formed over the active devices to create functional circuits. Generally these interconnect structures include conductive features (e.g., metal lines and vias) formed in a plurality of stacked dielectric layers. To reduce the capacitive coupling of conductive features in dielectric layers, low-k dielectric materials are generally used for interconnect layers. However, as the density of conductive features increases in these layers, traditional low-k materials may no longer sufficiently reduce capacitive coupling.

Voids may be formed in dielectric layers to further reduce the k-value of the dielectric material and reduce parasitic capacitance amongst conductive features. However, void formation in interconnect layers poses numerous challenges such as difficulties in controlling the dimensions of voids and the risk of damaging conductive features adjacent to voids during the subsequent patterning of any overlaying layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A semiconductor device having voids in a device layer and the method of forming the same are provided in accordance with various embodiments. The intermediate stages of forming the semiconductor device are illustrated. The variations of the embodiments are discussed. Throughout the various views and illustrative embodiments, like reference numbers are used to designate like elements.

Figure 1:
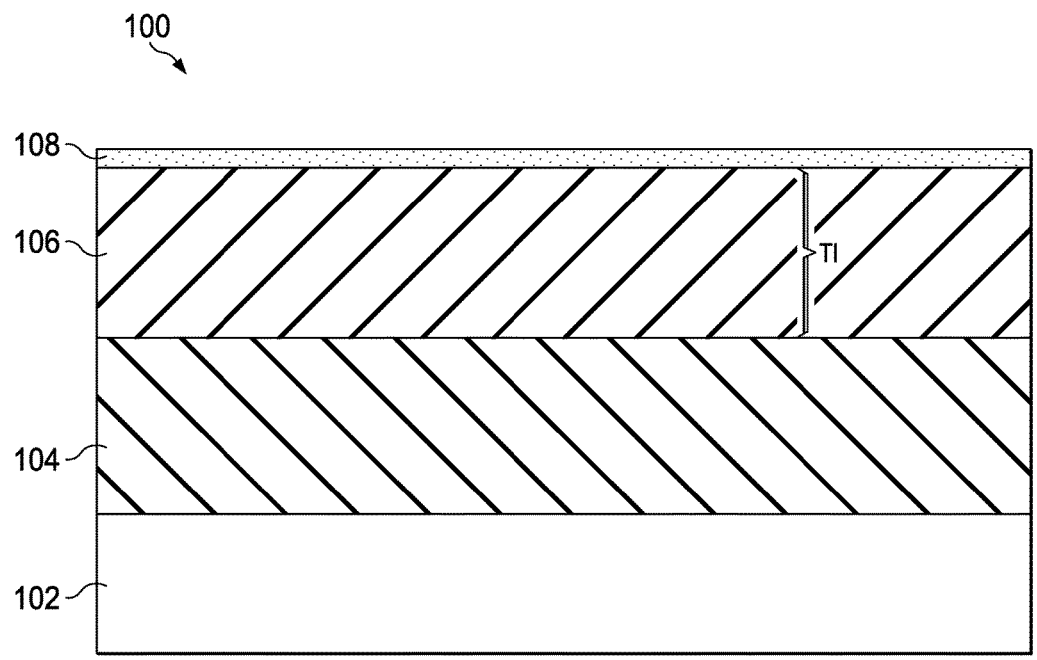
FIGS. 1-10 are cross-sectional views of various stages of manufacture of a semiconductor device having voids in accordance with various embodiments.

FIG. 1 shows a portion of a semiconductor device 100. Semiconductor device 100 includes a substrate 102 and active devices (not shown) such as transistors formed at a top surface of substrate 102. Substrate 102 may be a bulk silicon substrate although other semiconductor materials including group III, group IV, and group V elements may also be used. Alternatively, substrate 102 may be a silicon-on-insulator (SOI) substrate.

A dielectric layer 104 may be formed over substrate 102. Dielectric layer 104 may be an inter-layer dielectric (ILD) or an inter-metal dielectric layer (IMD) formed over the substrate using any suitable method (e.g., chemical vapor deposition (CVD), plasma enhanced CVD (PECVD), or the like). Dielectric 104 may be formed of low-k dielectric materials having k values, for example, lower than about 4.0 or even 2.8. In some embodiments, dielectric 104 may comprise silicon oxide, SiCOH, and the like. Although FIG. 1 illustrates dielectric layer 104 as directly above and contacting substrate 102, there may be any number of additional dielectric layers (e.g., including conductive interconnect features) disposed between dielectric 104 and substrate 102.

A hard mask 106 is formed over dielectric layer 104. Hard mask 106 may be a metal hard mask comprising, for example titanium nitride, titanium oxide, or the like. Other hard mask materials may also be used. Hard mask 106 may be formed using any suitable method such as physical vapor deposition, CVD, or the like. In some embodiments, hard mask 106 may have a thickness T1 of about 200 Å to about 1000 Å. Thickness T1 of hard mask 106 may be chosen in accordance with a desired dimension of subsequently formed voids in semiconductor device 100 as will be discussed in greater detail below. An anti-reflective layer 108 (e.g., a nitrogen free anti-reflective coating (NFARC)) may be formed over hard mask 106. Anti-reflective layer 108 may aid in the patterning of hard mask 106 in subsequent process steps.

Figure 2:
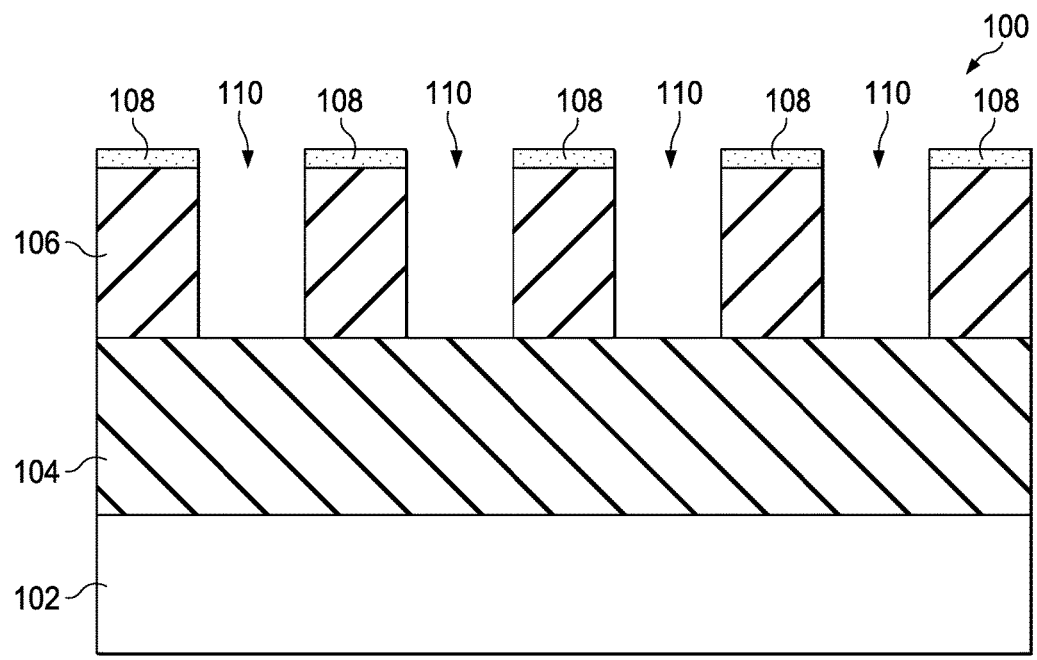

FIG. 2 illustrates the patterning of hard mask 106 (and anti-reflective layer 108) to form openings 110 extending through hard mask 106 and exposing portions of dielectric layer 104. The patterning of hard mask 106 may be achieved, for example, using a combination of photolithography and etching techniques. In some embodiments, the etching technique may include a dry etching of hard mask 106 using $Cl_2$, $O_2$, $C_xH_yF_z$, $N_2$, $H_2$, or a combination thereof as a process gas.

Figure 3:
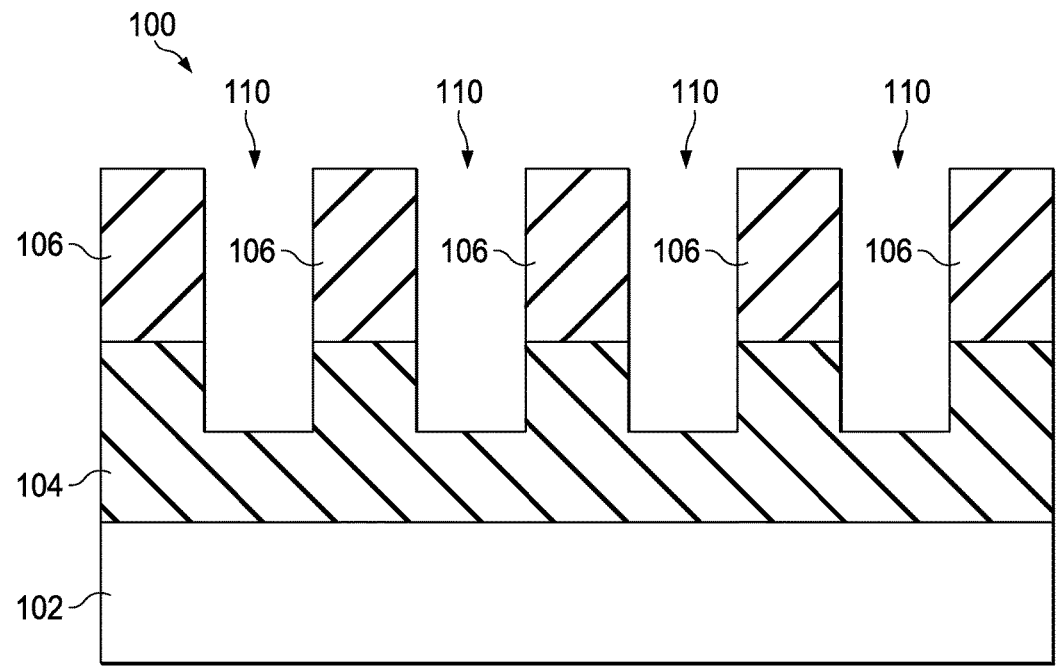

FIG. 3 shows the patterning of dielectric layer 104 using hard mask 106 as a patterning mask to extend openings 110 into dielectric layer 104. The patterning of dielectric layer 104 may include an anisotropic etching technique, which also removes anti-reflective layer 108. In some embodiments, the etching technique may include a dry etching of dielectric 104 using $O_2$, $CO_2$, $C_xH_yF_z$, Ar, $N_2$, $H_2$, or a combination thereof as a process gas.

Figure 4:
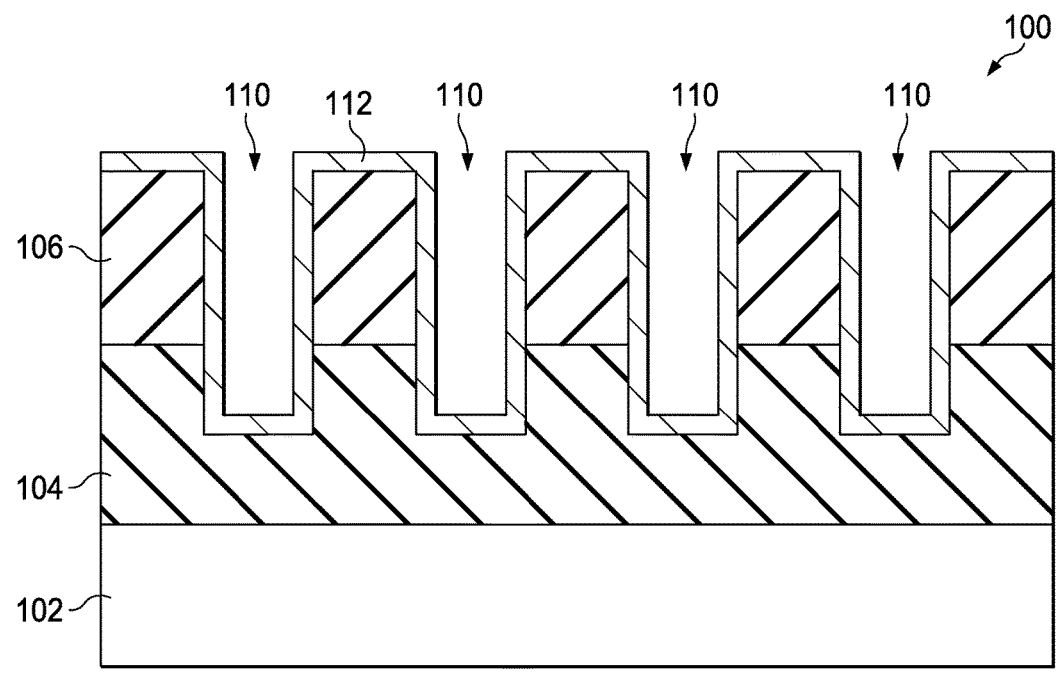

FIG. 4 illustrates the formation of a barrier layer 112 over hard mask 106 and in openings 110. Barrier layer 112 may cover sidewalls and a bottom surface of openings 110. Barrier layer 112 may comprise, for example, tantalum nitride, or the like. In various embodiments, barrier layer 112 may be formed of a different material than hard mask 106 so that hard mask 106 may be selectively removed without removing barrier layer 112 in subsequent process steps. Barrier layer 112 may prevent the diffusion of metallic material of subsequently formed vias into surrounding layers (e.g., dielectric layer 104). Barrier layer 112 may be deposited over hard mask 106 using any suitable deposition process, such as CVD, PVD, a conformal deposition process, or the like.

Figure 5:
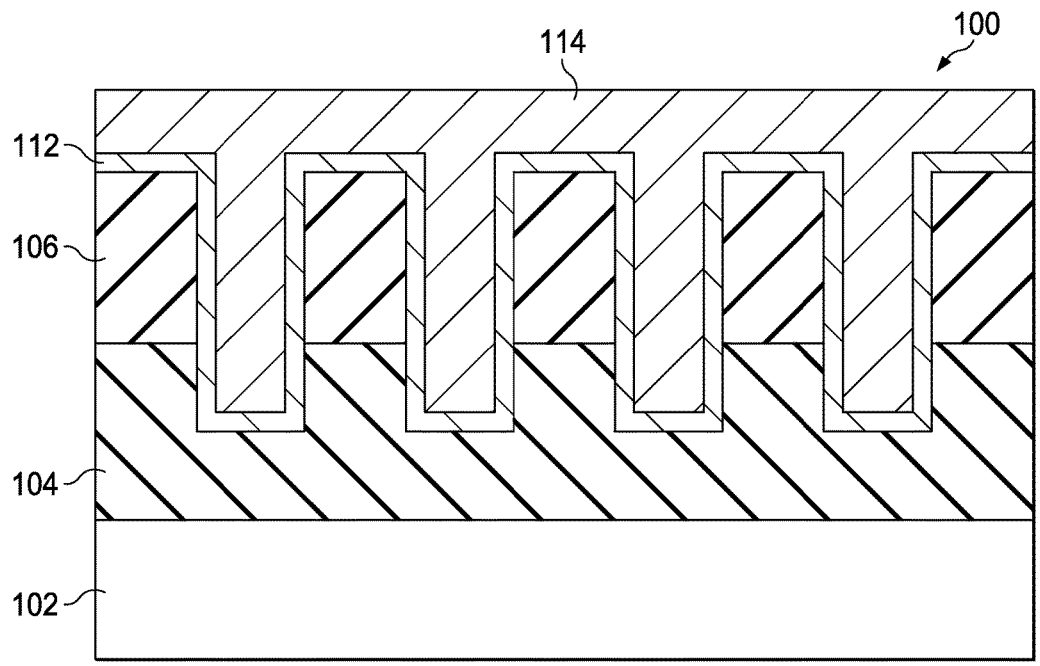
Figure 6:
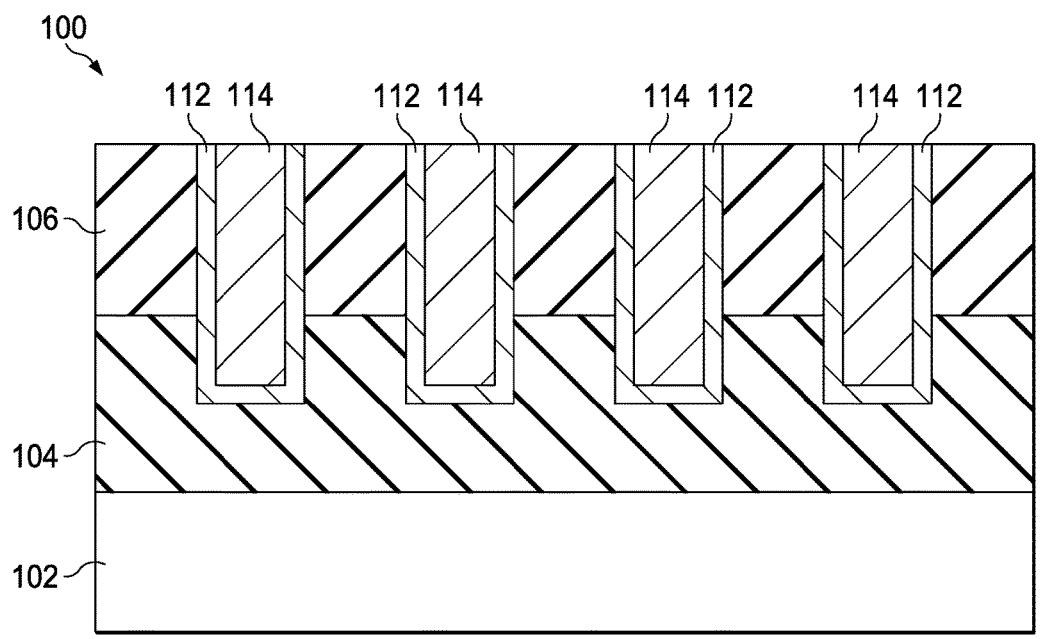

FIGS. 5 and 6 illustrate the filling of openings 110 to form conductive lines, such as metal lines 114, extending through hard mask 106 and into dielectric layer 104. First, as illustrated by FIG. 5, a metallic material 114 such as copper, a copper alloy, tungsten, aluminum, or another suitable conductor may be deposited into openings 110. The deposition of metallic material 114 may overflow openings 110 and cover hard mask 106. Subsequently, as illustrated by FIG. 6, a planarization (e.g., a chemical mechanical polish (CMP) or an etch back technique) maybe used to remove overflow portions. As part of the planarization, top portions of barrier layer 112 may also be removed, exposing hard mask 106. The removal rate selectivity proportion (e.g., a ratio of the removal rates of the differing materials as a result of the planarization) of metallic material 114 (e.g., copper)/barrier layer 112 (e.g., tantalum nitride) to hard mask 106 (e.g., titanium nitride) may be greater than about 50. The remaining metallic material in hard mask 106 and dielectric layer 104 forms a plurality of metal lines 114. Thus, dielectric layer 104 may be referred to as a metal layer having metal lines 114 (sometimes referred to as $M_x$). In various embodiments, at least two metal lines 114 are formed although the total number of metal lines may vary depending on layout design. Furthermore, metal lines 114 may be electrically connected to other conductive features (e.g., conductive vias, not shown) in dielectric layers underlying dielectric layer 104 (not shown), which may electrically connect metal lines 114 to active devices (not shown) in substrate 102.

Figure 7:
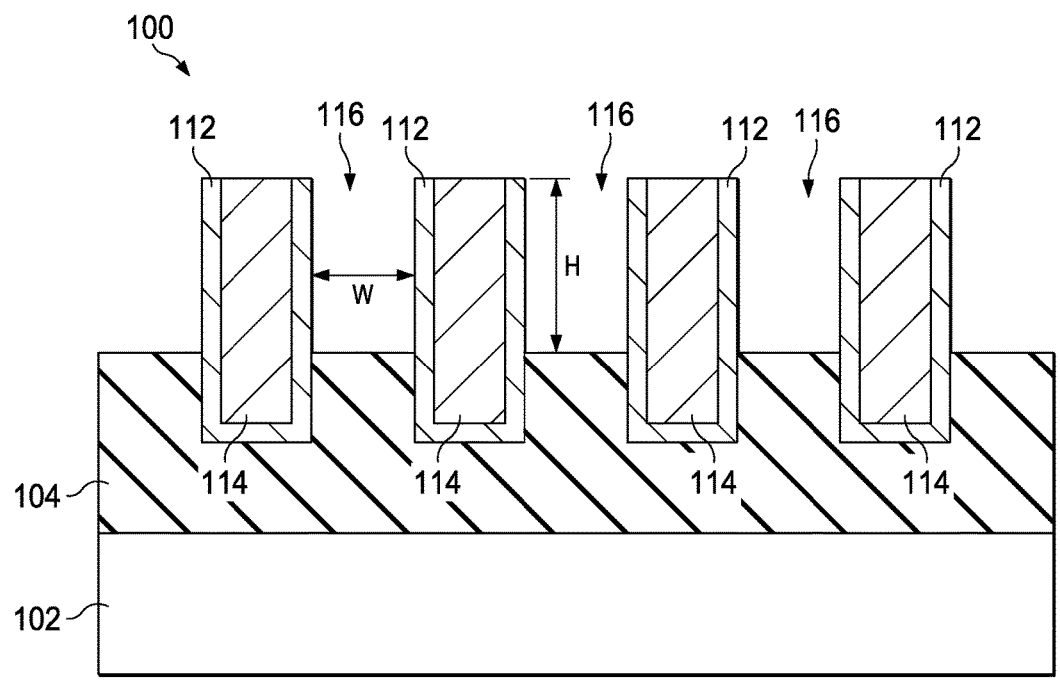

FIG. 7 illustrates the removal of hard mask 106 without removing metal lines 114/barrier layer 112. The removal of hard mask 106 forms a plurality of openings 116 disposed between metal lines 114. Openings 116 have a width W and a height H. Height H is equal to thickness T1 of hard mask 106 (see FIG. 1, i.e., H may be between about 200 Å and 1000 Å), and width W may be less than about 32 nanometers. However, in various embodiments, the aspect ratio (i.e., H over W) of openings 116 is greater than 1. The removal of hard mask 106 may include a wet etch process using an etchant that does not significantly attack metal lines 114/barrier layer 112. For example, a removal rate selectivity proportion of hard mask 106 to metal lines 114/barrier layer 112 may be greater than about 100. The wet etch process of hard mask 106 may use polyethylene-polypropylene glycol, a glycolether compound, an oxirane based polymer, an organosulfur compound, methylimidazole, aminoethanol, aminopropanol, hydroxyamine, tetramethylammonium hydroxide, a hydrophobic surfactant, a hydrophilic surfactant (mixed with or without hydrogen peroxide), a combination thereof, or the like as a chemical etchant. The use of hard mask 106 to create openings 116 allows for greater control in defining the dimension of subsequently formed voids as height H is directly related to thickness T1 of hard mask 106. Furthermore, the wet etch process used to remove hard mask 106 may not significantly attack metal lines 114/barrier 112, and thus openings 116 may be formed without damaging other features in semiconductor device 100.

Figure 8A:
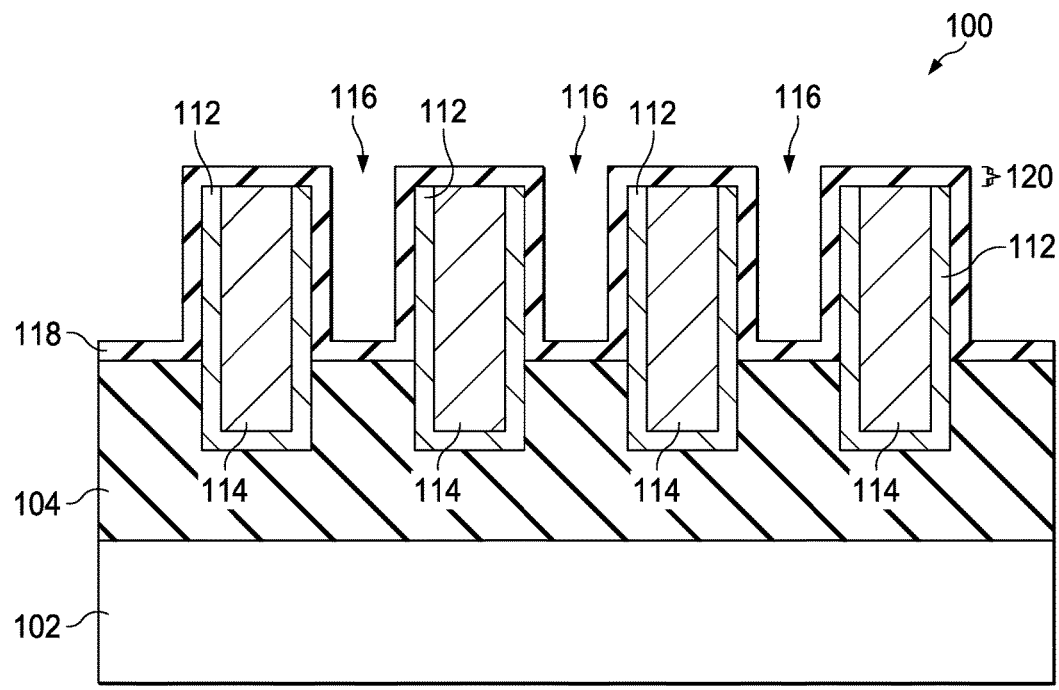
Figure 8B:
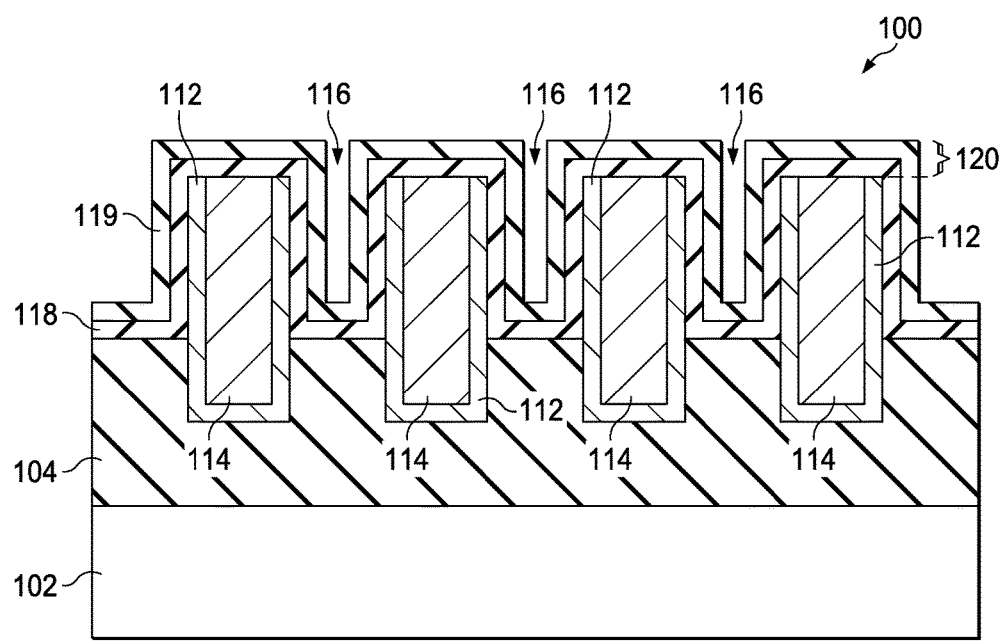

FIGS. 8A and 8B illustrates the formation of an etch stop layer 120 over metal lines 114 for protecting metal lines 114 in subsequent process steps. Etch stop layer 120 may be deposited to cover top surfaces of metal lines 114 and also sidewalls and bottom surfaces of openings 116. In some embodiments, as illustrated by FIG. 8B, etch stop layer 120 comprises a liner 118. Liner 118 may be formed using any suitable method. For example, liner 118 may comprise a combination of aluminum, oxygen, and/or nitrogen (e.g., $Al_xO_yN_z$, $Al_xO_y$, or the like) formed using an atomic layer deposition (ALD) process. In some embodiments, the ALD process used to form liner 118 may be performed at a temperature of about 200° C. to about 450° C., at a pressure of about 0.1 Torr to about 5 Torr, and using a process gas such as $N_2$ (e.g., at a gas flow rate of about 100 standard cubic centimeters per minute (sccm) to about 1000 sccm), $NH_3$ (e.g., at a gas flow rate of about 200 sccm to about 2000 sccm), or the like.

Alternatively, as illustrated in FIG. 8B, etch stop layer 120 may include a second liner 119 over liner 118 to cover top surfaces of metal lines 114 and also sidewalls/bottom surfaces of openings 116. Liner 119 may be between about 1nm and 10 nm thick, and liner 119 may comprise SiOC, SiCN, SiC, SiN, another combination of $SiO_xC_yN_z$, combinations thereof, or the like. Liner 119 may be formed using any suitable method such as a CVD process performed at a temperature of about 200° C. to about 450° C., at a pressure of about 1 Torr to about 10 Torr, and using a process gas such as $N_2$ (e.g., at a gas flow rate of about 10 sccm to about 3000 sccm), $NH_3$ (e.g., at a gas flow rate of about 10 sccm to about 1000 sccm), $CO_2$ (e.g., at a gas flow rate of about 10 sccm to about 1000 sccm), He (e.g., at a gas flow rate of about 10 sccm to about 2000 sccm), Ar (e.g., at a gas flow rate of about 10 sccm to about 1000 sccm), $H_2$ (e.g., at a gas flow rate of about 10 sccm to about 1000 sccm), or the like.

In embodiments where etch stop layer 120 include both liners 118 and 119, liner 118 may be used to improve the adhesion of liner 119. Furthermore, in such embodiments, a thinner liner 118 may be used than in embodiments where etch stop layer 120 includes liner 118 alone. A thinner liner 118 may allow for increased throughput and lowered manufacturing cost as a CVD process is generally less costly with a higher throughput than an ALD process. Alternatively, a CVD process may be used to form liner 118 alone without overlaying liner 119. In various embodiments, etch stop layer 120 may be sufficiently thick to prevent damage to metal lines 114 and dielectric layer 104 in subsequent process steps. For example, etch stop layer 120 may be between about 2 nm and about 15 nm thick.

Figure 9:
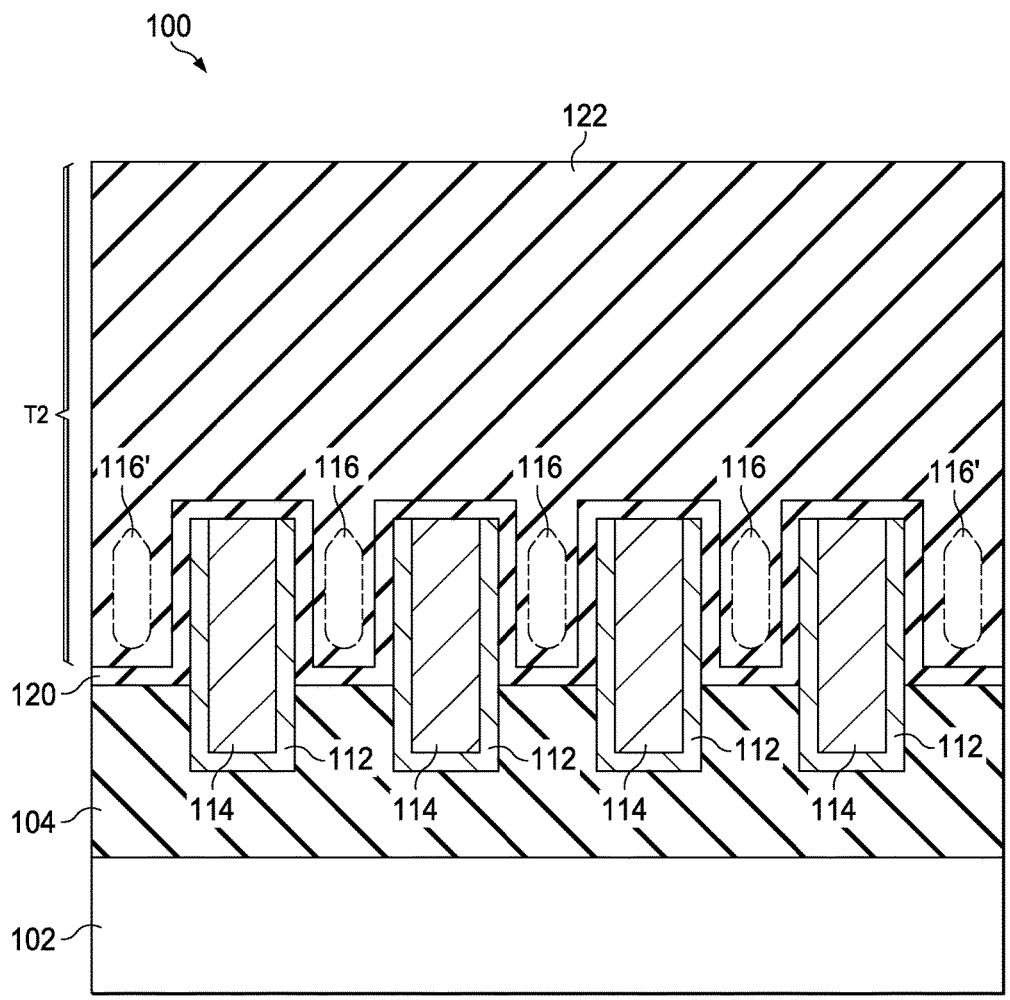

FIG. 9 illustrates the formation of another dielectric layer 122 over metal lines 114 and dielectric layer 104. Dielectric layer 122 may be substantially similar to dielectric layer 104. The formation of dielectric layer 122 may not completely fill openings 116. That is, upper portions of openings 116 are pinched off, sealing openings 116, which may now be referred to as voids 116. Openings 116 may be seamed together as an effect of the deposition process used to form dielectric layer 122 because of the sufficiently high aspect ratio (i.e., greater than one) of openings 116. For example, the deposition of dielectric layer 122 may be formed using a process such as CVD or the like. More particularly, the material of dielectric layer 122 may build up on the upper portions of openings 116 faster than along the sidewalls and bottom of openings 116 as a result of the openings' sufficiently high aspect ratio. This process leads to the formation of an overhang at the edge of the upper portion of opening 116, and as the deposition process continues, the overhangs will merge, sealing off opening 116 and forming voids 116. Voids 116 lower the k-value of the dielectric layer, advantageously lowering any parasitic capacitance amongst conductive features (e.g., metal lines 114) in semiconductor device 100.

To allow for the proper formation of voids 116, dielectric layer 122 may be have a thickness T2 that is sufficiently larger than the height of openings 116 (i.e., as defined by the thickness of hard mask 106 in FIG. 1). For example, thickness T2 may be between about 80 nm and about 250 nm. In various embodiments, a ratio of thickness T2 to thickness T1 may be between about 2.8 to about 3.3 so that voids 116 may be properly formed. While FIG. 9 illustrates the inclusion of voids 116' at peripheral areas of device 100, in other embodiments, such voids 116 may be filled depending on the dimension (i.e., the width/aspect ratio) between metal lines 114 and any adjacent features (not shown) in semiconductor device 100. After the deposition of dielectric layer 122, a planarization (e.g., a CMP or etch back) may be performed to level a top surface of dielectric layer 122.

Figure 10:
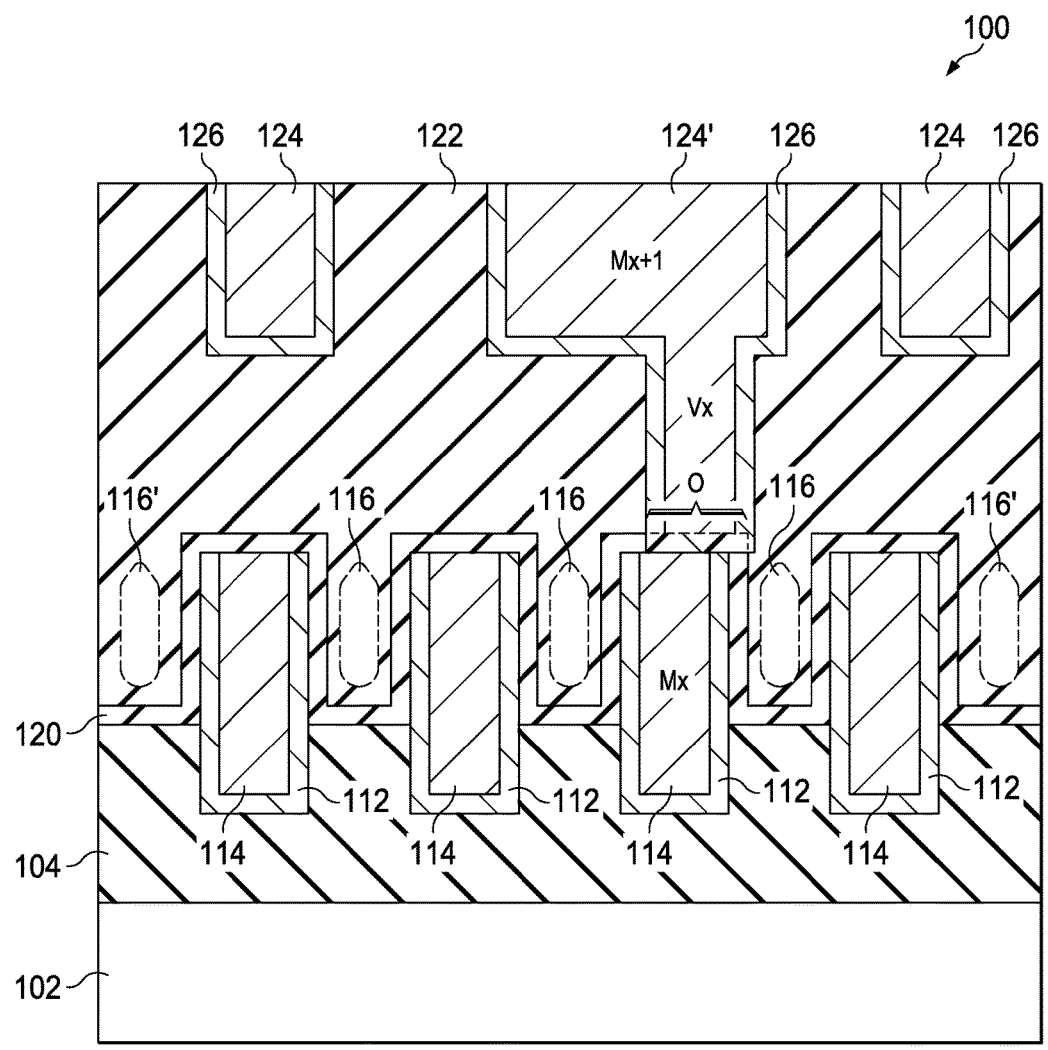

FIG. 10 illustrates the formation conductive features 124 in dielectric layer 122. Thus, dielectric layer 122 may be a metal layer directly above dielectric layer 104 (e.g., $M_x$). Conductive features 124 may include metal lines (e.g., $M_{x+1}$) and vias (e.g., $V_x$) which may be substantially similar to metal lines 114. Conductive features may further include a barrier layer 126, which may be substantially similar to barrier layer 112. The formation of conductive features 124 may include patterning dielectric layer 122 (e.g., using photolithography and etching techniques) and the filling of patterned dielectric layer 122 with a conductive material.

Certain conductive features (e.g., conductive feature 124') may be electrically connected to one or more metal lines 114. Due to limitations in semiconductor patterning techniques, conductive feature 124' may not be perfectly aligned with metal line 114. That is, the actual overlay portion O between conductive feature 124' and metal line 114 may be relatively small. For example, portion O may be less than 8 nm in half-pitch 32 nm node devices or even less than 6 nm in half-pitch 23 nm node devices. Etch stop layer 120 prevents damage to metal lines 114 and dielectric layer 104 that may occur due to any misalignments during the patterning of dielectric layer 122. That is, etch stop layer 120 is sufficiently thick to prevent any unintentional etching of metal lines 114 and dielectric layer 104 due to any misalignment errors. Thus, etch stop layer 120 allows for voids 116 to be disposed adjacent to metal lines 114 electrically connected to conductive features 124'.

Figure 11:
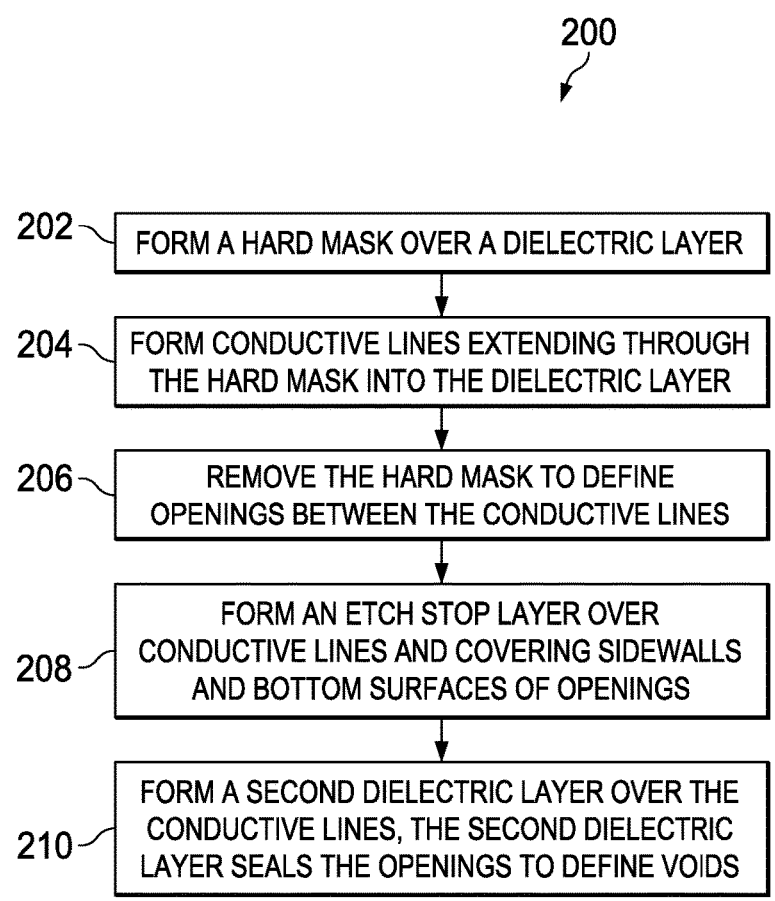
FIG. 11 illustrates a flow chart for forming voids in a semiconductor device layer in accordance with various embodiments.

FIG. 11 illustrates a flow chart of a process 200 for forming voids in a semiconductor device layer in accordance with various embodiments. First in step 202, a hard mask (e.g., hard mask 106) is formed over a dielectric layer (e.g., dielectric layer 104). Next in step 204, two or more conductive lines (e.g., metal lines 114) are formed extending through the hard mask and the dielectric layer. The formation of the conductive lines may include first patterning two or more openings extending through the hard mask into the dielectric layer, for example, using a dry etch process. These openings are then filled with a metallic material to form the conductive lines. The formation of the conductive lines may further include forming a barrier layer around sidewalls and bottom surfaces of the conductive lines to prevent metal diffusion into surrounding layers.

The hard mask is then removed in step 206 to define openings between the conductive lines. The removal of the hard mask may be done, for example, using a wet etching process and choosing a chemical etchant that does not significantly attach the conductive lines (including any barrier layers) and dielectric layer 104. The openings may have an aspect ratio greater than 1 to facilitate the formation of voids in subsequent process steps.

In step 208, an etch stop layer (e.g., etch stop layer 120) is formed over the conductive lines. The etch stop layer may cover a top surface of the conductive lines and sidewalls/bottom surfaces of the openings. The etch stop layer may include a liner (e.g., formed using an ALD process). In some embodiments, the etch stop layer may also include a second liner (e.g., formed using a CVD process) over the first liner. The etch stop layer may be sufficiently thick to prevent damage to the conductive lines and the dielectric layer during the subsequent patterning of overlaying features in the semiconductor device.

In step 210, a second dielectric layer (e.g., dielectric layer 122) is formed over the conductive lines using a suitable deposition process (e.g., CVD). As a result of the sufficiently high aspect ratio of the openings defined by the removal of the hard mask, the deposition of the second dielectric layer seals the openings (e.g., the second dielectric layer does not completely fill the openings). The openings are pinched off to define voids disposed between the conductive lines. Subsequently, additional conductive features (e.g., conductive features 124) may be formed in the second dielectric layer, and some of these conductive features may be electrically connected to the conductive lines. The formation of the conductive features may include a patterning process, and the etch stop layer protects the metal lines from any inadvertent damage during the patterning process due to limitations in processing techniques (e.g., limitations of photolithography/etching). The inclusion of a sufficiently robust etch stop layer allows for voids to be formed adjacent metal lines electrically connected to the conductive features.

In accordance with an embodiment, a method includes forming a hard mask over a dielectric layer and forming a first conductive line and a second conductive line extending through the hard mask into the dielectric layer. The method further includes removing the hard mask, wherein removing the hard mask defines an opening between the first and second conductive lines. A liner is then formed over the first and second conductive metal lines and the dielectric layer, wherein the liner covers sidewalls and a bottom surface of the opening.

In accordance with another embodiment, a method includes forming a hard mask over a first dielectric layer, patterning the hard mask to form two or more first openings extending through the hard mask, and patterning the first dielectric layer to extend the two or more first openings into the first dielectric layer. The method further includes forming two or more metal lines in the hard mask and the dielectric layer by filling the two or more first openings with a metallic material. The hard mask is then removed to define one or more second openings between adjacent metal lines of the two or more metal lines. An etch stop layer is formed over the two or more metal lines and the first dielectric layer. The etch stop layer covers sidewalls and a bottom surface of the one or more second openings. A second dielectric layer is formed over the etch stop layer and the first dielectric layer. Forming the second dielectric layer pinches off the one or more second openings to define one or more voids. The method further includes forming one or more metallic features the second dielectric layer. At least one of the one or more metallic features is electrically connected to at least one of the two or more metal lines.

In accordance with yet another embodiment, a semiconductor device includes a first dielectric layer, a first and second metal lines in the first dielectric layer, and a void disposed between the first and second metal lines. Top surfaces of the first and second metal lines are higher than a top surface of the first dielectric layer. The device further includes a liner extending along a first sidewall of the first metal line, an adjacent second sidewall of the second metal line, and a top surface of a portion of the first dielectric layer disposed between the first and second metal lines.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device comprising:
   forming a hard mask over a first dielectric layer, wherein the hard mask has a first thickness measured between a topmost surface of the hard mask and a bottommost surface of the hard mask;
   forming a first conductive line and a second conductive line extending through the hard mask into the first dielectric layer;
   removing the hard mask, wherein the removing the hard mask defines an opening between the first conductive line and the second conductive line;
   forming a first liner over the first conductive line, the second conductive line, and the first dielectric layer, wherein the first liner covers sidewalls and a bottom surface of the opening, and wherein the first liner contacts top surfaces of the first conductive line and the second conductive line;
   forming a second dielectric layer over the first conductive line, the second conductive line, and the first dielectric layer, wherein the second dielectric layer has a second thickness measured between a topmost surface of the second dielectric layer and a bottommost surface of the second dielectric layer, and wherein a ratio of the first thickness to the second thickness in the range of 2.8 to 3.3, wherein the forming the second dielectric layer seals the opening to define a void between the first conductive line and the second conductive line, a top of the void is lower than a top surface of the first conductive line; and
   forming a conductive feature in the second dielectric layer, wherein the conductive feature is electrically connected to the first conductive line, and wherein a bottom surface of the conductive feature contacts a top surface of the first liner, and wherein the top surface of the first liner is level with a top surface of the first conductive line.

2. The method of claim 1, further comprising forming a second liner over and contacting the first liner, wherein the second liner covers the sidewalls and the bottom surface of the opening.

3. The method of claim 2, wherein the forming the first liner comprises an atomic layer deposition (ALD) process, and wherein forming the second liner comprises a chemical vapor deposition (CVD) method.

4. The method of claim 1, wherein the first liner is an etch stop layer comprising aluminum oxide, aluminum oxynitride, or a combination thereof.

5. The method of claim 1, wherein the removing the hard mask comprises a wet etch process.

6. The method of claim 5, wherein the wet etch process comprises using polyethylene-polypropylene glycol, a glycolether compound, an oxirane based polymer, an organosulfur compound, methylimidazole, aminoethanol, aminopropanol, hydroxyamine, tetramethylammonium hydroxide, a hydrophobic surfactant, a hydrophilic surfactant, a mixture comprising hydrogen peroxide, or a combination thereof as a process gas.

7. The method of claim 1, wherein the opening has an aspect ratio greater than 1.

8. A method for forming a semiconductor device comprising:
   forming a hard mask over a first dielectric layer;
   patterning the hard mask to form two or more first openings extending through the hard mask;
   patterning the first dielectric layer to extend the two or more first openings into the first dielectric layer;
   forming a barrier layer over the hard mask and lining the two or more first openings;
   forming two or more metal lines in the hard mask and the first dielectric layer by filling the lined two or more first openings with a metallic material, wherein after forming the two or more metal lines, the barrier layer is on bottom surfaces and sidewalls of the two or more metal lines and the barrier layer extends to a top surface of the hard mask;
   removing the hard mask to define one or more second openings between the barrier layer on sidewalls of adjacent metal lines of the two or more metal lines, wherein the two or more metal lines extends above a top surface of the first dielectric layer by a first height;
   forming an etch stop layer over the two or more metal lines and the first dielectric layer, wherein the etch stop layer covers sidewalls and a bottom surface of the one or more second openings;
   forming a second dielectric layer over the etch stop layer and the first dielectric layer, wherein the second dielectric layer pinches off the one or more second openings to define one or more voids, wherein a portion of the second dielectric layer is disposed between a void and a metal line, wherein a top of the void is lower than a top surface of the two or more metal lines, wherein the portion of the second dielectric layer is thicker at a top of the void than at a bottom of the void, wherein the second dielectric layer has a first thickness measured between a topmost surface of the second dielectric layer and a bottommost surface of the second dielectric layer, and wherein a ratio of the first height to the first thickness in the range of 2.8 to 3.3; and
   forming one or more metallic features in the second dielectric layer, wherein a first one of the one or more metallic features is electrically connected to at least one of the two or more metal lines, and wherein the first one of the one or more metallic features extends below a first top surface of the etch stop layer and contacts a second top surface of the etch stop layer lower than the first top surface.

9. The method of claim 8, wherein the forming the etch stop layer comprises an atomic layer deposition (ALD) process, a chemical vapor deposition (CVD) process, or a combination thereof.

10. The method of claim 8, wherein the etch stop layer comprises two liner layers.

11. The method of claim 8, wherein the forming the hard mask and the forming the second dielectric layer comprise forming the second dielectric layer to have a first thickness greater than a second thickness of the hard mask.

12. The method of claim 8, wherein the patterning the hard mask comprises a first dry etch process, and wherein the patterning the first dielectric layer comprises a second dry etch process.

13. The method of claim 8, wherein the removing the hard mask comprises a wet etch process using a chemical etchant that removes the hard mask without removing the two or more metal lines or the first dielectric layer.

14. The method of claim 8 further comprising prior to patterning the hard mask, forming an anti-reflective layer over the hard mask, wherein patterning the first dielectric layer to extend the two or more first openings into the first dielectric layer comprises using an etching process to etch the first dielectric layer and also remove the anti-reflective layer.

15. An semiconductor device comprising:
- a first dielectric layer comprising a low-k dielectric material having a k-value less than 4.0;
- a first metal line and a second metal line in the first dielectric layer, wherein top surfaces of the first metal line and the second metal line are higher than a top surface of the first dielectric layer by a first height;
- a first barrier layer on a bottom surface and sidewalls of the first metal line, and a second barrier layer on a bottom surface and sidewalls of the second metal line;
- a first liner extending along a top surface of the first metal line, a top surface of the first barrier layer, a first sidewall of the first barrier layer, an adjacent second sidewall of the second barrier layer, and a top surface of a portion of the first dielectric layer disposed between the first barrier layer and the second barrier layer ;
- a second dielectric layer over the first liner and comprising a conductive feature electrically connected to the first metal line, wherein the conductive feature extends across an interface between a sidewall of the first liner and a sidewall of the first metal line, wherein the second dielectric layer has a first thickness measured between a topmost surface of the second dielectric layer and a bottommost surface of the second dielectric layer, and wherein a ratio of the first height to the first thickness in the range of 2.8 to 3.3; and
- a void disposed between the first metal line and the second metal line, wherein the void is formed entirely within the second dielectric layer, and wherein a top of the void is lower than top surfaces of the first metal line and the first barrier layer.

16. The device of claim 15 wherein the first liner comprises aluminum oxide, aluminum oxynitride, or a combination thereof.

17. The device of claim 15 further comprising a second liner over and contacting the first liner, wherein the second liner extends along the first sidewall of the first metal line, the adjacent second sidewall of the second metal line, and the top surface of the portion of the first dielectric layer disposed between the first metal line and the second metal line, and wherein the second dielectric layer is disposed over the second liner between a first portion of the second liner extending along the first sidewall of the first metal line and a second portion of the second liner extending along the adjacent second sidewall of the second metal line.

18. The device of claim 17 wherein the second liner comprises SiOC, SiCN, SiC, SiN, or a combination thereof.

* * * * *